(12) United States Patent
Curtin et al.

(10) Patent No.: US 6,731,061 B1
(45) Date of Patent: May 4, 2004

(54) DUAL LAYER ELECTROPLATED STRUCTURE FOR A FLAT PANEL DISPLAY DEVICE

(75) Inventors: Christopher J. Curtin, Friday Harbor, WA (US); Ronald S. Besser, Ruston, LA (US); Robert M. Duboc, Jr., Menlo Park, CA (US)

(73) Assignees: Candescent Technologies Corporation, Los Gatos, CA (US); Candescent Intellectual Property Services, Inc., Los Gatos, CA (US)

( * ) Notice: Subject to any disclaimer, the term of this patent is extended or adjusted under 35 U.S.C. 154(b) by 278 days.

(21) Appl. No.: 09/773,983

(22) Filed: Jan. 31, 2001

Related U.S. Application Data

(63) Continuation-in-part of application No. 09/310,464, filed on May 12, 1999, now Pat. No. 6,235,179.

(51) Int. Cl.$^7$ .................................................. H01J 1/62
(52) U.S. Cl. ...................... 313/495; 313/309; 313/336; 313/351
(58) Field of Search ................................ 313/495–497, 313/309, 336, 351, 422, 313, 330, 466; 445/24, 25, 50, 51

(56) References Cited

U.S. PATENT DOCUMENTS

| 5,098,860 A | | 3/1992 | Chakravorty et al. ........ 437/195 |
| 5,477,105 A | * | 12/1995 | Curtin et al. ................ 313/422 |
| 5,725,787 A | | 3/1998 | Curtin et al. ................. 216/25 |
| 5,818,153 A | | 10/1998 | Allen .......................... 313/306 |
| 5,827,099 A | | 10/1998 | Spindt et al. ................. 445/24 |
| 5,972,193 A | | 10/1999 | Chou et al. .................. 205/122 |
| 5,989,404 A | | 11/1999 | Kiyomiya et al. ............. 205/96 |
| 6,094,001 A | * | 7/2000 | Xie ............................. 313/309 |

* cited by examiner

Primary Examiner—Nimeshkumar D. Patel
Assistant Examiner—Joseph Williams

(57) ABSTRACT

A low-contaminant dual layer apparatus adapted for use in a flat panel display device is described. The apparatus includes a dual layer electroplated structure for containing the movement of electrons. The electroplated structure resides within an active region of the flat panel display device. The electroplated structure has a cavity adapted to having sub-pixel forming material deposited within and contains substantially no organic material.

3 Claims, 19 Drawing Sheets

DUAL LAYER ELECTROPLATED STRUCTURE FOR A FLAT PANEL DISPLAY DEVICE

CROSS REFERENCE TO RELATED APPLICATION

This Application is a Continuation-in-Part of commonly-owned Ser. No. 09/310,464 filed May 12, 1999, now U.S. Pat. No. 6,235,179 B1 filed May 12, 1999 and issued May 22, 2001, entitled "ELECTROPLATED STRUCTURE FOR A FLAT PANEL DISPLAY DEVICE" to Besser et al.

FIELD OF THE INVENTION

The present claimed invention relates to the field of flat panel displays. More particularly, the present claimed invention relates to interior structures of a flat panel display device.

BACKGROUND ART

Flat panel display devices often operate using electron emitting structures, such as, for example, Spindt-type field emitters. These types of flat panel displays typically employ a metallized structure to focus or define the path of electrons emitted from the electron emitting structures. In one prior art approach, the structure is referred to as a "focus waffle." The focus waffle is comprised of a "sheet" or film-like structure having a plurality of openings formed therethrough. The focus waffle is disposed between the electron emitting structures and the faceplate such that emitted electrons pass through openings in the focus waffle structure, and are directed towards corresponding sub-pixel regions.

Additionally, the aforementioned sub-pixel regions on the faceplate of flat panel display are typically separated by an opaque mesh-like structure commonly referred to as a black matrix. By separating sub-pixel regions, the black matrix prevents electrons directed at one sub-pixel from being "back-scattered" and striking another sub-pixel. In so doing, the black matrix helps maintain a flat panel display with sharp resolution. In addition, the black matrix is also used as a base on which to locate structures such as, for example, support walls.

Unfortunately, due to the extremely high cost of certain types of material used to form the black matrix or focus waffle (especially photo-patternable polyimide material), such prior art black matrix and focus waffle structures are extremely expensive. As a result, a conventional black matrix and/or a focus waffle made of expensive material such as polyimide introduces substantial additional costs to flat panel display fabrication. As yet another disadvantage, such prior art focus waffle and black matrix structures made of organics such as polyimide material are a major source of contamination in flat panel display devices. Typically, such contamination results from electron bombardment of the organic black matrix or focus waffle during normal operation of the flat panel display device. Hence, such "dirty" focus waffle and black matrix structures introduce contaminate particles and/or desorbing gaseous species into the evacuated environment of the flat panel display device. These contaminate particles degrade the performance of the flat panel display device and reduce the effective lifetime of the flat panel display device via contamination of field emission surfaces and other possible mechanisms.

Thus, a need exists for a structure on the display cathode which effectively directs electrons emitted from electron emitters. A further need exists on the faceplate for a structure which effectively separates neighboring phosphor sub-pixels. A further need exists for a structure which meets the above-listed needs and which eliminates the use of expensive and contaminant producing material.

SUMMARY OF INVENTION

The present invention provides, in one embodiment, a structure on the display cathode which effectively directs electrons emitted from electron emitters. The present invention provides, in another embodiment, a structure on the faceplate which effectively separates neighboring phosphor sub-pixels. The present invention, in each of the above-mentioned embodiments, achieves the above-listed accomplishments without requiring the use of expensive and contaminant-producing material such as polyimide.

Specifically, in various embodiments, a dual layer electroplated structure for a field emission display device and a method for forming a dual layer electroplated structure for a field emission display device are disclosed. In one embodiment, the present invention is comprised of a method which includes the step of forming an opaque conductive layer over selected portions of a flat panel display device. The present embodiment then electroplates material onto the opaque conductive layer disposed over the selected portions of said flat panel display device. In the present embodiment, these steps are performed such that a dual layer electroplated structure is formed over the selected portions of the flat panel display device. As a result, the present embodiment eliminates the cost and production of outgassed contaminants associated with prior art structures.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrates embodiments of the invention and, together with the description, serve to explain the principles of the invention.

The drawings referred to in this description should be understood as not being drawn to scale except if specifically noted.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1A:
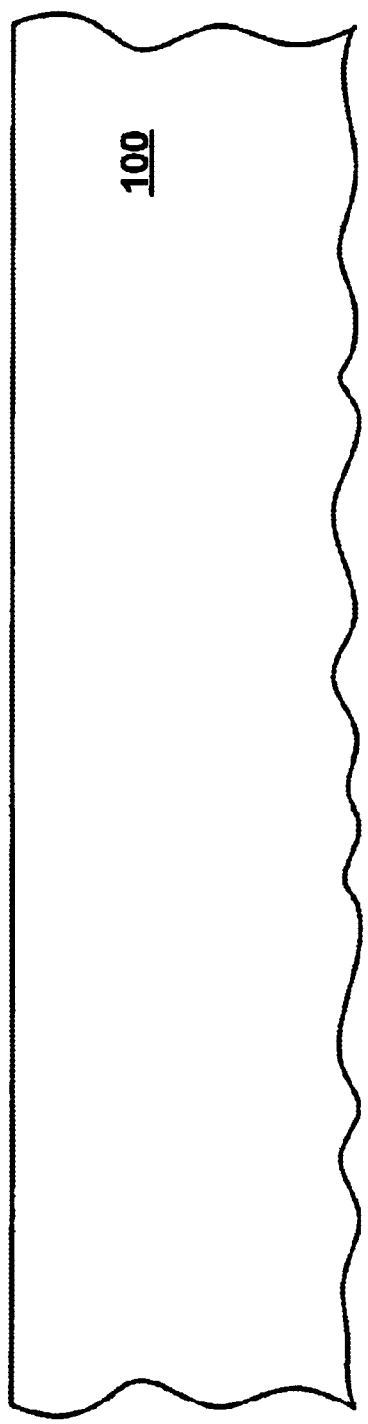
FIGS. 1A–1F are side sectional views of process steps used to form an electroplated structure in accordance with one embodiment of the present claimed invention.

With reference now to FIGS. 1A–1F, side sectional views of process steps used to form an electroplated structure in accordance with the present claimed invention are shown. Referring specifically to FIG. 1A, a side-sectional view of a starting point in the formation of an electroplated structure is shown. The following detailed description of the process steps of FIGS. 1A–1F, will pertain to the formation of an electroplated focus waffle as well as to the formation of an electroplated black matrix. Hence, as will be set forth below, the process steps of the present embodiment are adapted for use in forming an electroplated focus waffle and/or an electroplated black matrix. Although portions of the present embodiment refer to a black matrix, it will be understood that the term "black" refers to the opaque, low reflectivity characteristic of the matrix. Thus, the present invention is also well suited to having a color other than black.

With reference to FIG. 1A, the present embodiment begins with underlying structure 100. In one embodiment (e.g. an embodiment which forms an electroplated black matrix, "a black matrix embodiment"), underlying structure 100 is a faceplate of, for example, a flat panel display device. In another embodiment, (e.g. an embodiment which forms an electroplated focus waffle, "a focus waffle embodiment"), underlying structure 100 is a cathode of, for example, a flat panel display device such as a field emission display device.

Figure 1B:
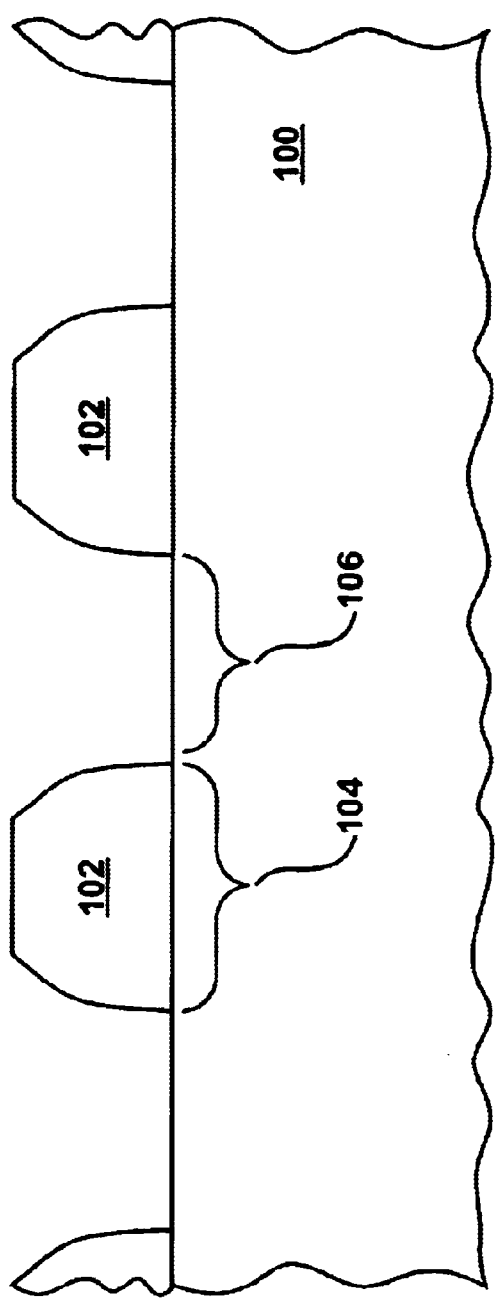

Referring next to FIG. 1B, the present embodiment then forms molded structures over selected portions 104 of the flat panel display device. In the present embodiments, the molded structures are comprised of structures 102 of photosensitive material such as photoresist. In one embodiment, the photoresist is deposited, masked, exposed, and the unexposed photoresist is then rinsed to form structures 102 at desired locations. As shown in FIG. 1B, structures 102 are formed overlying regions 104 and are not formed above regions 106. In the black matrix embodiment, regions 104 are sub pixel regions, and regions 106 are regions disposed between sub-pixel regions 104. Furthermore in the black matrix embodiment, structures 102 have a height of approximately 50 microns. In a focus waffle embodiment, regions 104 are electron emitting portions of a field emission display device, and regions 106 are regions between electron emitting portions of the field emission display device. Additionally, in the focus waffle embodiment, structures 102 have a height of approximately 40–60 microns. Although such specific dimensions and materials will be recited in the present application, it will be understood that these dimensions and materials are exemplary and that the present invention is well suited to the use of various other dimensions and materials.

Figure 1C:
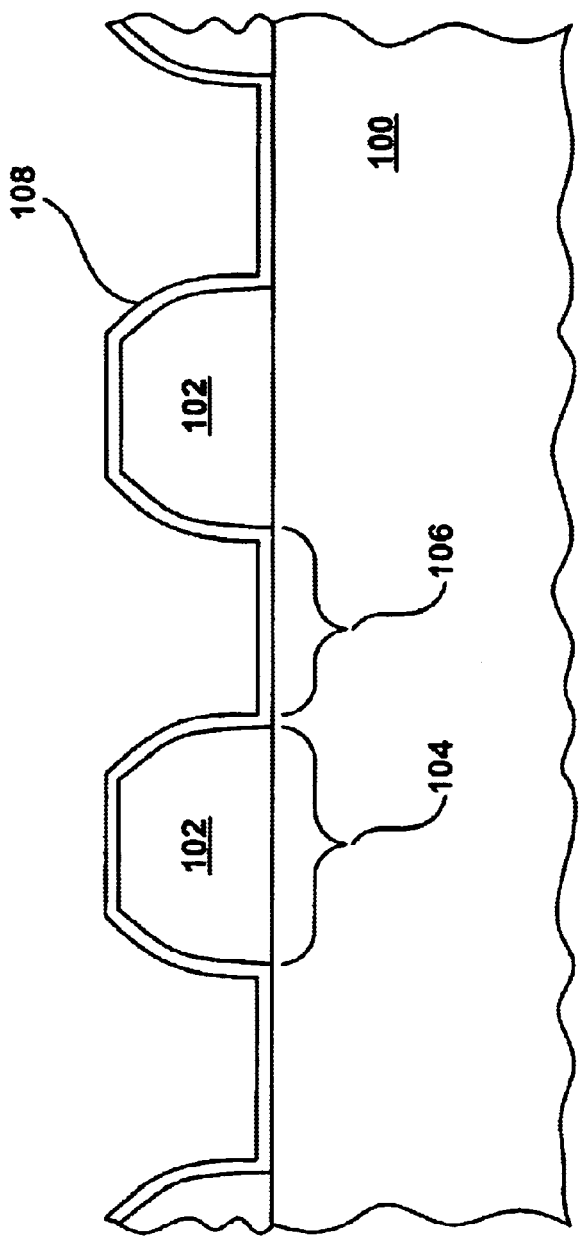

With reference now to FIG. 1C, in the present embodiments, an electroplating seed layer 108 is then deposited over structures 102 and regions 106. Electroplating seed layer 108 of the present embodiment is a double-layer of material which is sputter-coated over structures 102 and regions 106. In one embodiment, electroplating seed layer 108 is comprised of an initial opaque, low reflectivity sputter-coated layer of, for example, "black chrome", followed by the deposition of an electroplating-conducive material. Such electroplating-conducive material is comprised, for example, of nickel, gold, copper, silver, chrome, and the like. In one embodiment, electroplating seed layer 108 is formed having a thickness of approximately 1000 Angstroms. Additionally, in the black matrix embodiment, electroplating seed layer 108 does need to have a first opaque, low reflectivity layer.

Figure 1D:
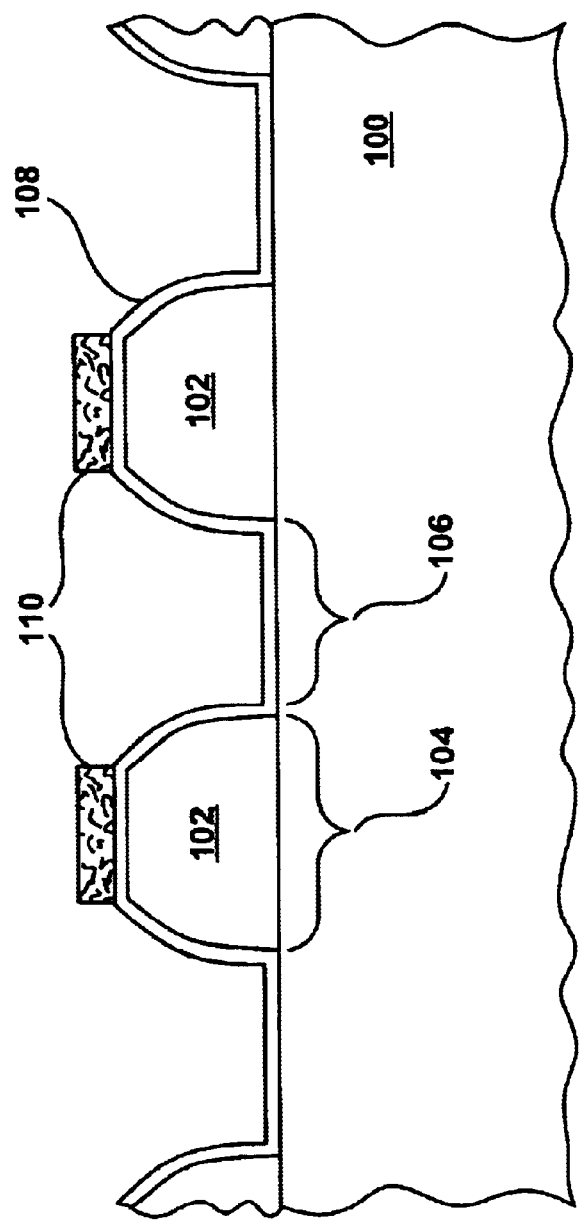

Referring now to FIG. 1D, after the deposition of electroplating seed layer 108, the present embodiment deposits second molded structures 110 on respective top surfaces of photoresist structures 102. In the present embodiments, the second molded structures are comprised of sections of photosensitive material such as photoresist. In one embodiment, the photoresist comprising the second molded structures is deposited, masked, exposed, and the unexposed photoresist is then rinsed to leave second molded structures 110 on the respective top surfaces of photoresist structures 102. In one embodiment second molded structures 110 have a thickness of approximately 5–10 microns.

Figure 1E:
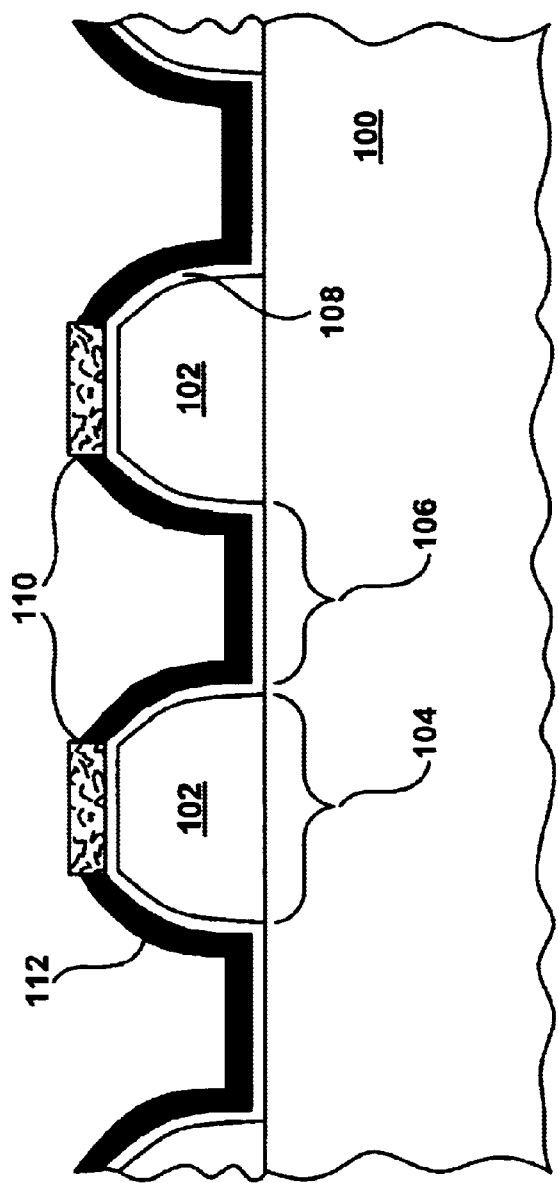

Next, as shown at FIG. 1E, the present embodiments electroplate of layer of material 112 onto portions of electroplating seed layer 108 such that an electroplated structure is formed at desired regions of the flat panel display device. More specifically, the structure of FIG. 1D has a potential applied thereto and is dipped in an aqueous solution of the material to be electroplated. The material to be electroplated to form electroplated layer 112 is, for example, nickel, gold, copper, silver, chromium, and the like. As shown in FIG. 1E, because second molded structures 110 are not conductive, substantially no material is electroplated thereon during the electroplating process. Hence, electroplated layer 112 is formed on electroplating seed layer 108 except for those portions of electroplating seed layer 108 which are covered by second molded structures 110. Thus, the respective top surfaces of structures 102 have little or no material electroplated thereover. Furthermore, in the present embodiment, electroplated layer 112 has a thickness of approximately 5–10 microns.

Figure 1F:
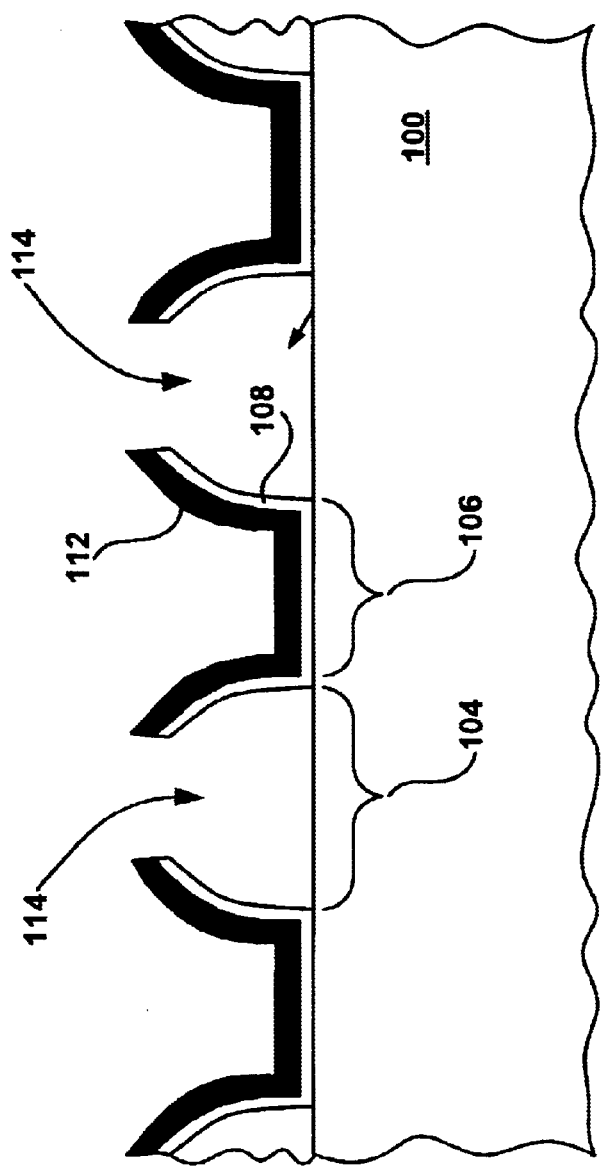

With reference now to FIG. 1F, the present embodiments then remove second molded structures 110 from respective top surfaces of photoresist structures 102. Removal of second molded structures 110 is accomplished using a photoresist removal process. The present embodiments then remove those portions of electroplating seed layer 108 which were residing beneath second molded structures 110 using an etchant (or etchants) corresponding to the material (or materials) comprising electroplating seed layer 108. Additionally, as shown in FIG. 1F, the present embodiments also remove photoresist structures 102 (using another photoresist removal process) such that a cavity 114 partially encapsulated by electroplated layer 112 (and underlying electroplating seed layer 108) remains. In a black matrix embodiment, cavity 114 is adapted to have sub-pixel forming material deposited therein. In a focus waffle embodiment, the remaining electroplated layer 112 forms walls which are adapted to focus electrons emitted by field emitters within the field emission display device. Hence, the present embodiments provide an electroplated black matrix and/or an electroplated focus waffle without requiring the use of expensive and contaminant producing polyimide material. Thus, the electroplated structure of the present embodiments is cheaper and cleaner than existing products.

As yet another advantage of the present embodiments, remaining portions of electroplated layer 112 can also be used to buttress support structures of the flat panel display device. For example, a support wall can reside above region 106 of the present embodiments. Furthermore, although remaining portions of electroplated layer 112 may appear "dome-shaped" above regions 104, the present embodiments are well suited to varying the shape of structures 102 and, thus, create remaining portions of electroplated layer 112 with a greater or lesser amount of curvature. In one embodiment, the curved shape of remaining portions of electroplated layer 112 helps to reflect electrons back towards the sub-pixel regions. Also, the conductive nature of remaining portions of electroplated layer 112 insures efficient bleeding of excess charges when desired.

Figure 2A:
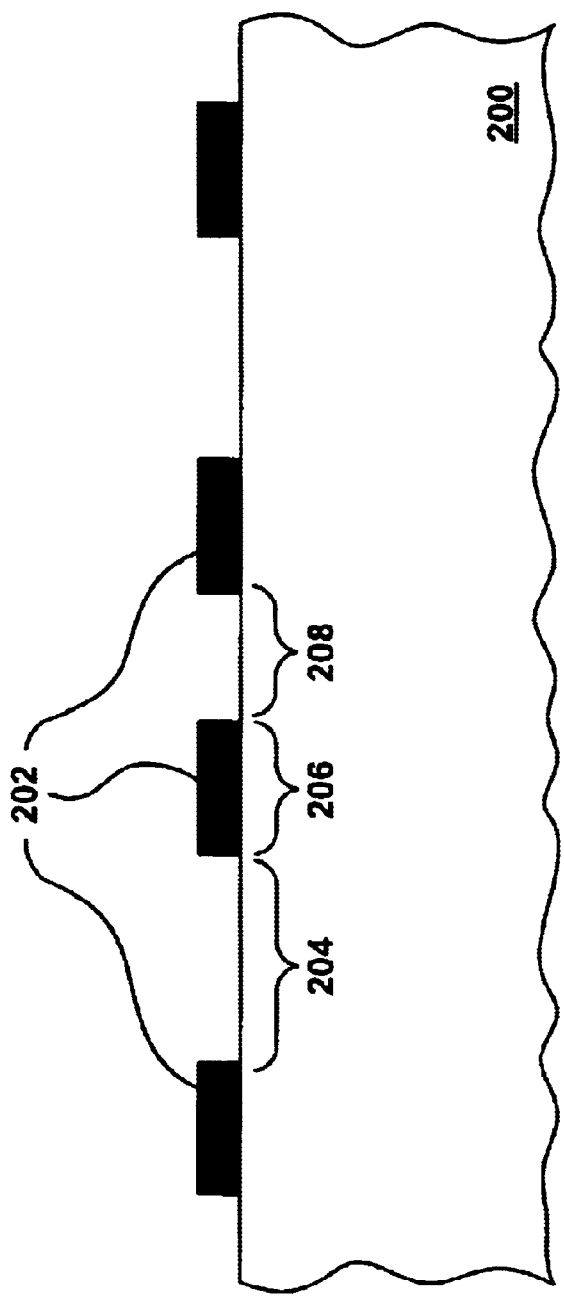
FIGS. 2A–2F are side sectional views of process steps used to form an electroplated structure in accordance with another embodiment of the present claimed invention.

With reference to FIGS. 2A–2F, side sectional views illustrating steps performed in accordance with other embodiments of the present invention are shown. As shown in FIG. 2A, the present embodiment begins with underlying structure 200. In one embodiment (e.g. an embodiment which forms an electroplated black matrix, "a black matrix embodiment"), underlying structure 200 is a faceplate of, for example, a flat panel display device. In another embodiment, (e.g. an embodiment which forms an electroplated focus waffle, "a focus waffle embodiment"), underlying structure 200 is a cathode of, for example, a flat panel display device such as a field emission display device.

Figure 2B:
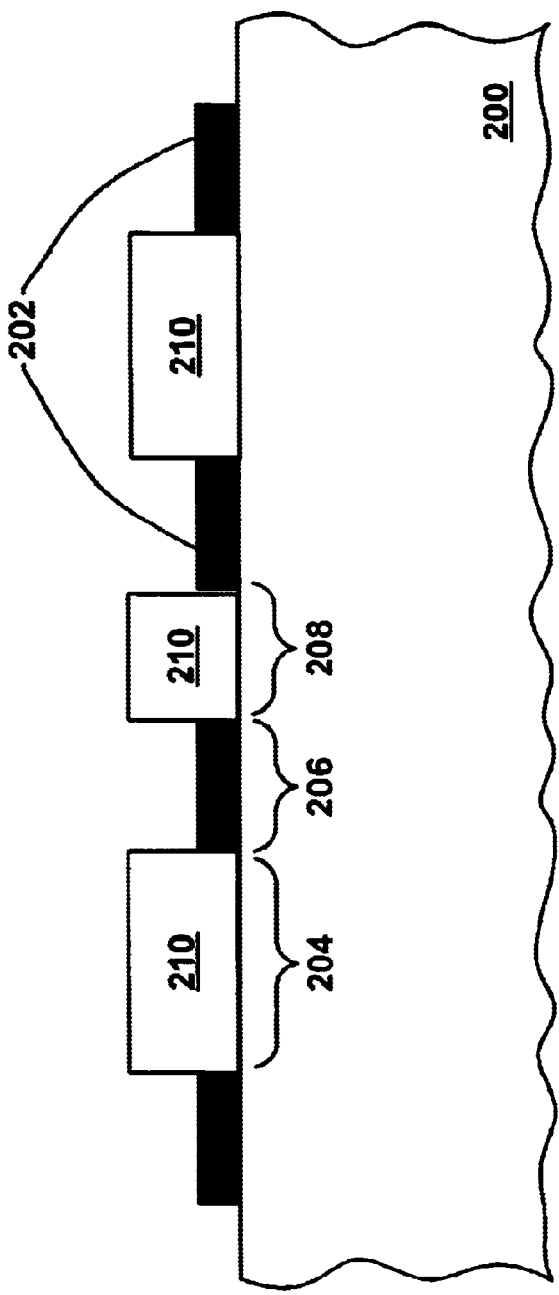

Referring still to FIG. 2A, the present embodiment then forms a thin film black matrix 202 over underlying structure 200. As shown in FIG. 2B, portions of thin film black matrix 202 are formed overlying regions 206 and are not formed above regions 204 and 208. In the black matrix embodiment, regions 204 and 208 are sub pixel regions and support structure regions, respectively. That is, in such an embodiment, a sub-pixel will subsequently be formed above region 204 and a support structure will be disposed above region 208. Regions 206 are regions above which will be formed an electroplated black matrix In a focus waffle embodiment, region 204 resides above electron emitting portions of a field emission display device, and regions 208 are regions between electron emitting portions of the field emission display device which may have support structures disposed thereover. Regions 206, in such an embodiment, are regions above which will be formed an electroplated focus waffle.

Referring next to FIG. 2B, the present embodiment then forms molded structures over selected portions 204 and 208 of the flat panel display device. In the present embodiments, the molded structures are comprised of pads 210 of photosensitive material such as photoresist. In one embodiment, the photoresist is deposited, masked, exposed, and the unexposed photoresist is then rinsed to form pads 210 at desired locations.

In one black matrix embodiment, the photosensitive material, after deposition above the entire surface of underlying structure 200 (including above thin film black matrix 202), is then exposed to light from the exterior surface of underlying structure 200 (a faceplate in this embodiment). By exposing the photosensitive material to light from the exterior surface of the faceplate, thin film black matrix 202 masks those portions of the photosensitive material which reside above thin film black matrix 202. As a result, those portions of photosensitive material which reside above thin film black matrix 202 are prevented from being exposed. Thus, only the photosensitive material residing above regions 204 and 208 is cured.

As shown in FIG. 2B, pads 210 are formed overlying regions 204 and 208 and are not formed above regions 206 (i.e. pads 210 are not formed 2D above thin film black matrix 202). Additionally, in the present embodiments, photoresist pads 210 have vertically oriented side surfaces and a horizontally oriented top surface. In the black matrix embodiment, photoresist pads 210 have a height of approximately 50 microns. In the focus waffle embodiment, photoresist pads 210 have a height of approximately 40–60 microns. Although such specific dimensions and materials will be recited in the present application, it will be understood that these dimensions and materials are exemplary and that the present invention is well suited to the use of various other dimensions and materials.

Figure 2C:
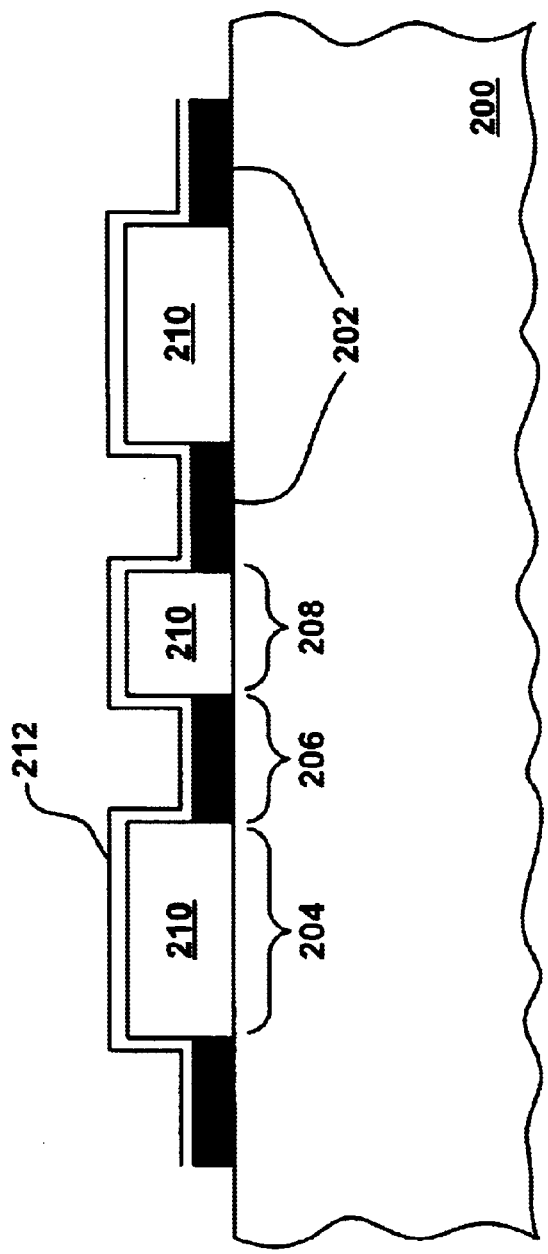

With reference now to FIG. 2C, in the present embodiments, an electroplating seed layer 212 is then deposited over photoresist pads 210 and above thin film black matrix 206. Electroplating seed layer 212 of the present embodiments is comprised of material which is sputter-coated over photoresist pads 210 and above thin film black matrix 202. In one embodiment, electroplating seed layer 212 is comprised of an initial opaque, low reflectivity sputter-coated layer of, for example, "black chrome", followed by the deposition of an electroplating-conducive material. Such electroplating-conducive material is comprised, for example, of nickel, gold, copper, silver, chromium, and the like. In one embodiment, electroplating seed layer 212 is formed having a thickness of approximately 1000 Angstroms. Additionally, in the focus waffle embodiment, electroplating seed layer 212 does need to have a first opaque, low-reflectivity layer.

Figure 2D:
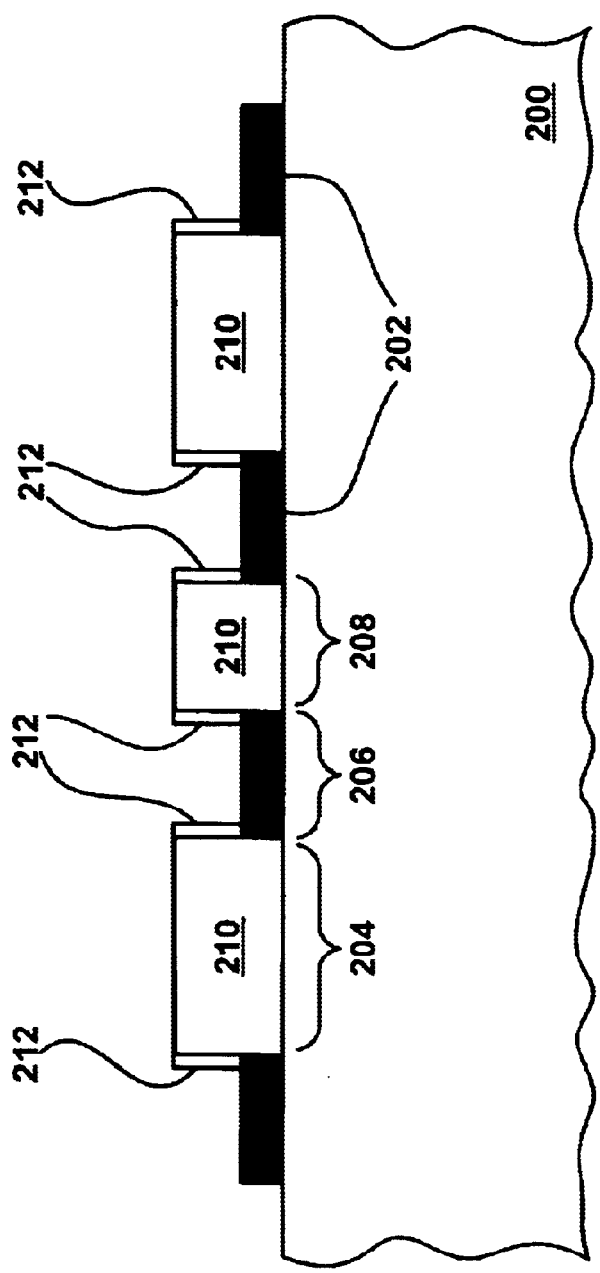

Referring now to FIG. 2D, the present embodiments then remove electroplating seed layer 212 from the horizontally oriented top surfaces of photoresist pads 210. As shown in FIG. 2D, the present embodiment also remove electroplating seed layer 212 from the top surface of thin film black matrix 202. In one embodiment, electroplating seed layer 212 is removed from the aforementioned horizontally oriented top surfaces using a directional dry etch such as, for example, a reactive-ion etch. As a result, electroplating seed layer 212 remains on the vertically oriented surfaces of photoresist pads 210.

Figure 2E:
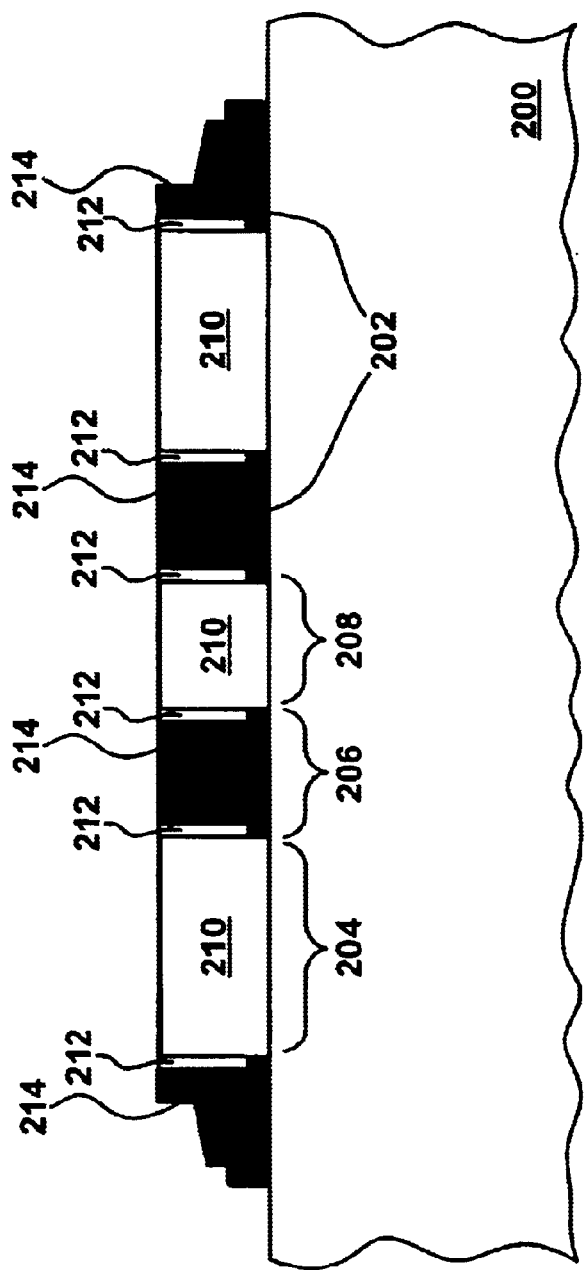

Next, as shown at FIG. 2E, the present embodiments electroplate of layer of material 214 onto the remaining portions of electroplating seed layer 212 such that an electroplated structure is formed at desired regions of the flat panel display device. Moreover, the present embodiments electroplate material onto the vertically-oriented, electroplating seed layer-coated, side surfaces of photoresist pads 210 without substantially electroplating material onto the horizontally oriented top surface of photoresist pads 210. More specifically, the structure of FIG. 2D has a potential applied thereto and is dipped in an aqueous solution of the material to be electroplated. The material to be electroplated to form electroplated layer 214 is, for example, nickel, gold, copper, silver, chrome, and the like. Because electroplating seed layer 212 remains only on the vertically oriented surfaces of photoresist pads 210 after the etching process illustrated in FIG. 2D, remaining portions of electroplating seed layer 212 function as an "electroplating frame". That is, the electroplating process is confined to the area between the electroplating seed layer-coated vertically oriented side surfaces of photoresist pads 210. Hence, in the present embodiment, the electroplating process is controlled and confined by previous easily and accurately controllable manufacturing steps used to form photoresist pads 210.

Figure 2F:
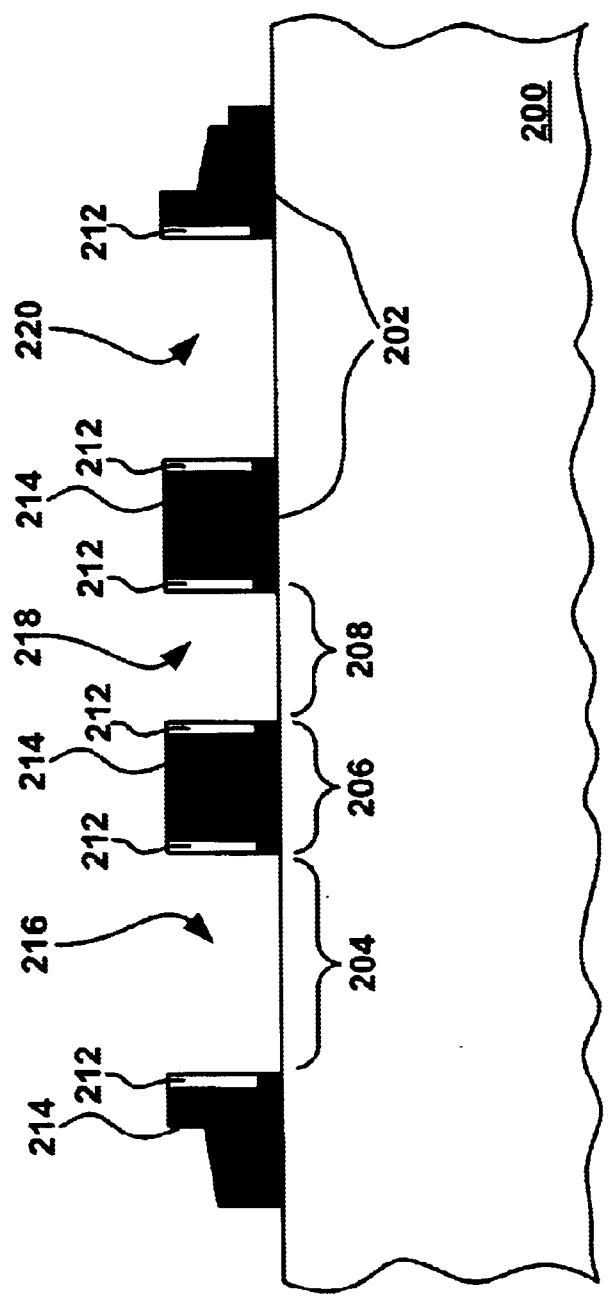

With reference now to FIG. 2F, the present embodiments then remove photoresist pads 210 (using a photoresist removal process) such that cavities 216, 218, and 220 partially encapsulated by electroplated layer 214 (and underlying electroplating seed layer 212) remains. In a black matrix embodiment, a portion of the cavities (e.g. cavities 216 and 220) is adapted to have sub-pixel forming material deposited therein. A second portion of the cavities (e.g. cavities 218) are adapted to have a support structure disposed therein. In a focus waffle embodiment, a portion of the cavities (e.g. cavities 216 and 220) is adapted to focus electrons emitted by field emitters within the field emission display device. A second portion of the cavities (e.g. cavities 218) are adapted to have a support structure disposed therein. Hence, the present embodiments provide an electroplated black matrix and/or an electroplated focus waffle without requiring the use of expensive and contaminant producing polyimide material. Thus, the electroplated structure of the present embodiments is cheaper and cleaner than existing products. In one embodiment, a polishing step is also performed to achieve uniform height.

As yet another advantage of the present embodiments, remaining portions of electroplated layer 212 can also be used to buttress support structures of the flat panel display device. For example, a support wall can reside above region 208 of the present embodiments. Also, the conductive nature of remaining portions of electroplated layer 212 insures efficient bleeding of excess charges when desired.

Figure 3:
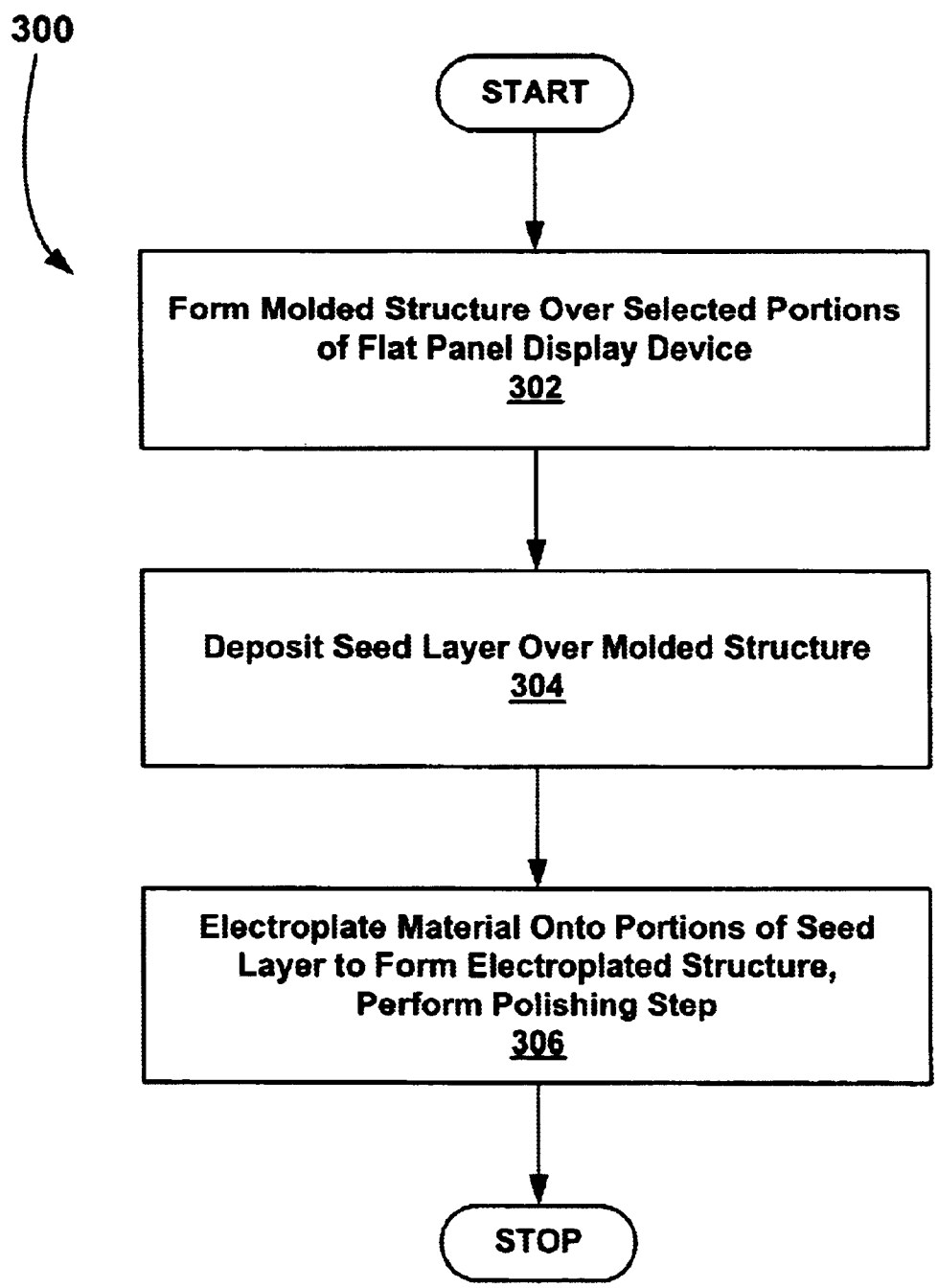
FIG. 3 is a flow chart of steps performed in accordance with one embodiment of the present claimed invention.

Referring now to FIG. 3, a flow chart 300 succinctly setting forth the aforementioned steps of one embodiment of the present invention is shown. At step 302, the present invention forms molded structures over selected portions of a flat panel display device.

Next, at step 304, the present invention deposits an electroplating seed layer over the molded structures formed at step 302.

Referring now to step 306, the present invention then electroplates material onto portions of the electroplating seed layer which was deposited at step 304. In so doing, the present invention forms an electroplated structure for a flat panel display device. As shown in step 306, in one embodiment, a polishing step is also performed to achieve uniform height.

Figure 4A:
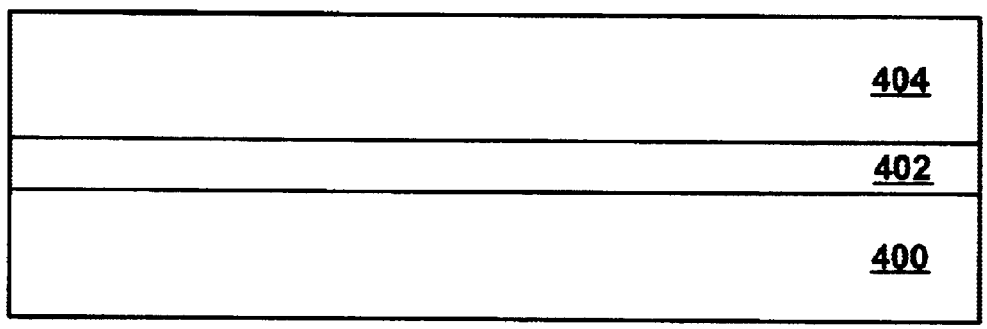
FIGS. 4A–4E are side sectional views of process steps used to form a dual layer black matrix structure in accordance with another embodiment of the present claimed invention.

With reference now to FIGS. 4A–4E, side sectional views of process steps used to form a dual layer electroplated structure in accordance with the present claimed invention are shown. Referring specifically to FIG. 4A, a side-sectional view of a starting point in the formation of a dual layer electroplated structure is shown. The following detailed description of the process steps of FIGS. 4A–4E, will pertain to the formation of a dual layer electroplated focus waffle as well as to the formation of a dual layer electroplated black matrix. Hence, as will be set forth below, the process steps of the present embodiment are adapted for use in forming a dual layer electroplated focus waffle and/or a dual layer electroplated black matrix. Although portions of the present embodiment refer to a dual layer black matrix, it will be understood that the term "black" refers to the opaque, low reflectivity characteristic of the matrix. Thus, the present invention is also well suited to having a color other than black.

With reference to FIG. 4A, the present embodiment begins with underlying structure 400. In one embodiment (e.g. an embodiment which forms a dual layer electroplated black matrix, "a dual layer black matrix embodiment"), underlying structure 400 is a faceplate of, for example, a flat panel display device. In another embodiment, (e.g. an embodiment which forms a dual layer electroplated focus waffle, "a dual layer focus waffle embodiment"), underlying structure 400 is a cathode of, for example, a flat panel display device such as a field emission display device.

Referring still to FIG. 4A, the present embodiment then deposits an initial opaque, low reflectivity sputter-coated layer 402 of, for example, "black chrome". In the present embodiment, a layer 404 of photosensitive material such as photoresist is then deposited above layer 402. In one embodiment, the black chrome layer is comprised of a dual layer of, for example, underlying black chrome and an overlying conductive layer.

Figure 4B:
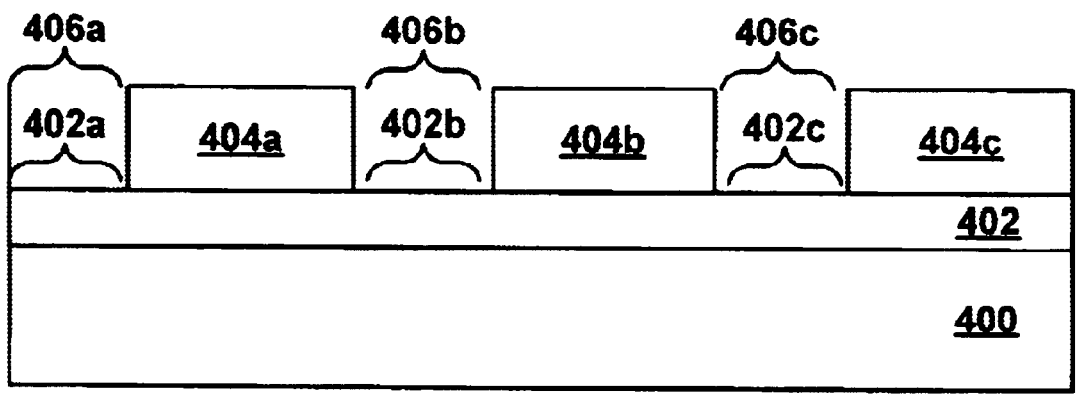

With reference now to FIG. 4B, layer 404 of photoresist is deposited, masked, exposed, and the unexposed photoresist is then rinsed to form structures 404a, 404b, and 404c at desired locations. As shown in FIG. 4B, structures 404a, 404b, and 404c are formed overlying desired regions of layer 402 and substrate 400. Additionally, openings 406a, 406b, and 406c are formed are formed above regions 402a, 402b, and 402c of layer 402. In the black matrix embodiment, regions underlying structures 404a, 404b, and 404c are sub pixel regions, and regions 406a, 406b, and 406c are regions disposed between sub-pixel regions. Furthermore in the black matrix embodiment, structures 404a, 404b, and 404c have a height of approximately 50 microns.

Referring still to FIG. 4B, in a focus waffle embodiment, regions underlying structures 404a, 404b, and 404c are electron emitting portions of a field emission display device, and regions 406a, 406b, and 406c are regions disposed between electron emitting portions of the field emission display device. Additionally, in the focus waffle embodiment, structures 404a, 404b, and 404c have a height of approximately 40–60 microns. Although such specific dimensions and materials will be recited in the present application, it will be understood that these dimensions and materials are exemplary and that the present invention is well suited to the use of various other dimensions and materials.

Figure 4C:
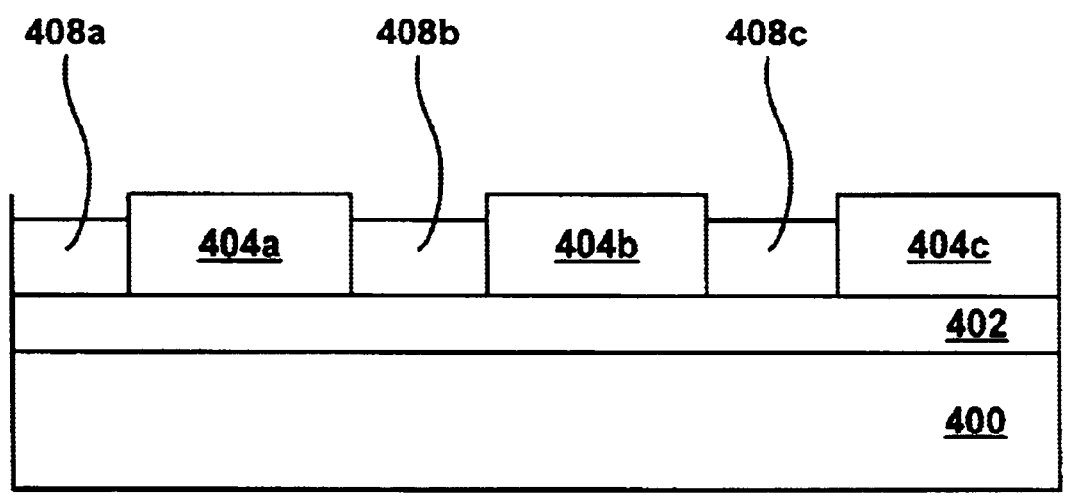

Next, as shown at FIG. 4C, the present embodiment electroplates material onto exposed regions 402a, 402b, and 402c of black chrome layer 402 such that electroplated structures 408a, 408b, and 408c are formed at desired regions of the flat panel display device. More specifically, in one embodiment, the structure of FIG. 4B has a potential applied thereto and is dipped in an aqueous solution of the material to be electroplated. The material to be electroplated to form electroplated structures 408a, 408b, and 408c is, for example, nickel, gold, copper, silver, chromium, and the like. As shown in FIG. 4C, because photoresist structures 404a, 404b, and 404c are not conductive, substantially no material is electroplated thereon during the electroplating process. Furthermore, in the present embodiment, electroplated structures 408a, 408b, and 408c typically have a height of approximately 40–60 microns.

Figure 4D:
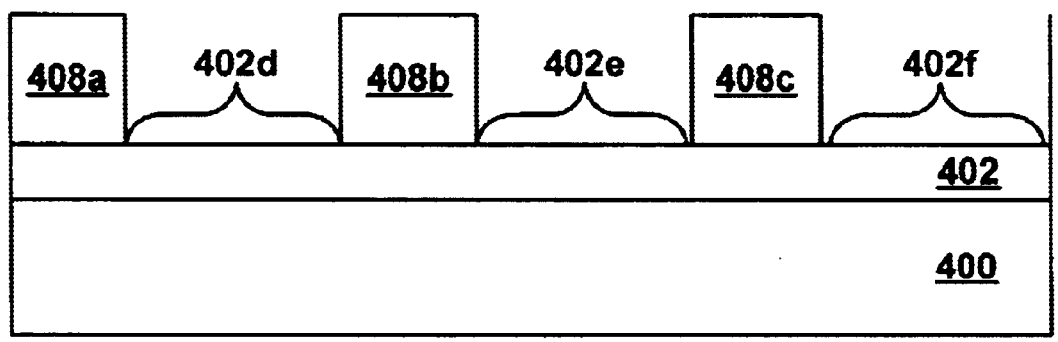

With reference now to FIG. 4D, the present embodiment then removes photoresist structures 404a, 404b, and 404c from respective regions 402d, 402e, and 402f of black chrome layer 402. Removal of photoresist structures 404a, 404b, and 404c is accomplished using a photoresist removal process.

Figure 4E:
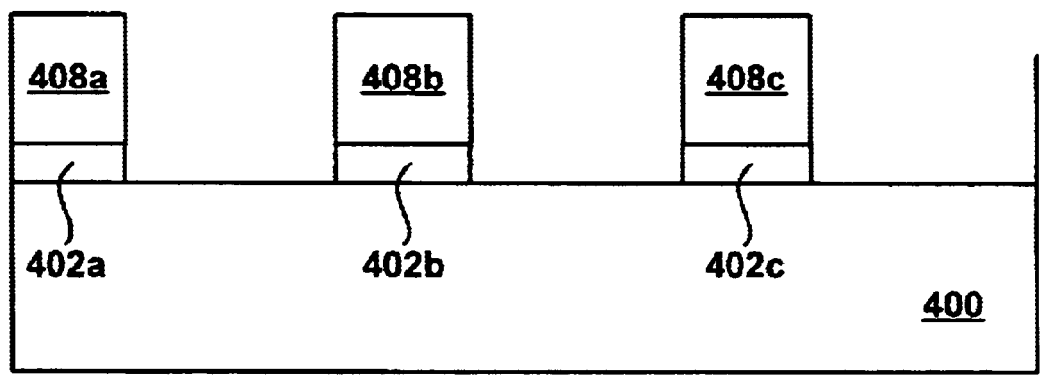

Referring now to FIG. 4E, the present embodiment then removes black chrome layer 402 from respective regions 402d, 402e, and 402f. As a result, dual layer structures (comprised at the base of regions 402a, 402b, and 402c, with overlying electroplated material 408a, 408b, and 408c, respectively) are left formed above substrate 400. In a black matrix embodiment, the regions between the electroplated structures are adapted to have sub-pixel forming material deposited therein. In a focus waffle embodiment, the electroplated structures focus electrons emitted by field emitters within the field emission display device. Hence, the present embodiment provides an electroplated dual layer black matrix and/or an electroplated dual layer focus waffle without requiring the use of expensive and contaminant producing polyimide material. Thus, the dual layer electroplated structure of the present embodiments is cheaper and cleaner than existing products.

Figure 5:
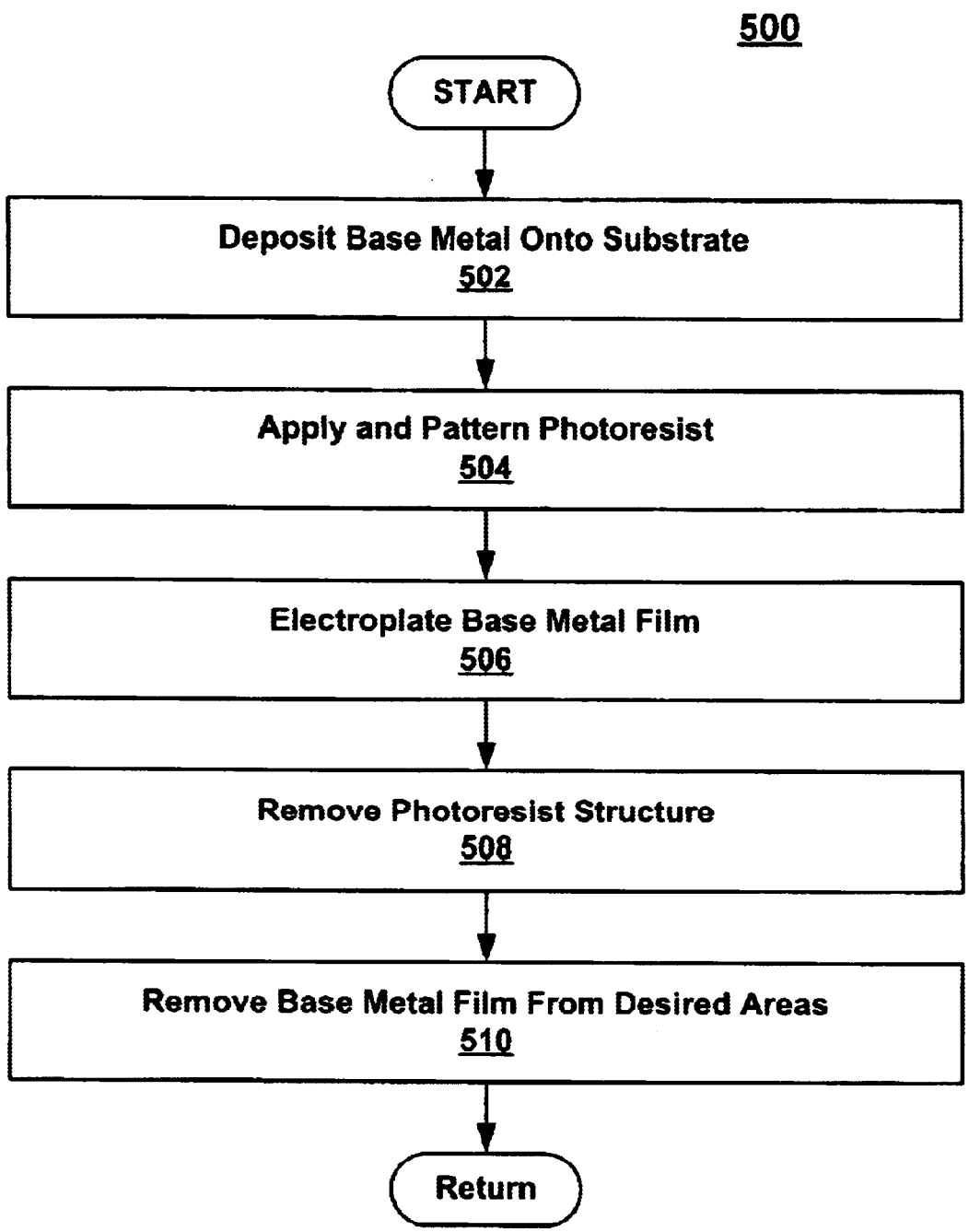
FIG. 5 is a flow chart of steps performed in accordance with one embodiment of the present claimed invention.

Referring now to FIG. 5, a flow chart 500 succinctly setting forth the aforementioned steps of the above-described dual layer embodiment of FIGS. 4A–4E is shown. At step 502, the present embodiment deposits a base metal film onto a substrate. In one embodiment, the black chrome layer is comprised of a dual layer of, for example, underlying black chrome and an overlying conductive layer.

Next, at step 504, the present embodiment applies and patterns a photoresist material formed at step 502.

Referring now to step 506, the present embodiment then electroplates material onto portions of the exposed base metal film which was deposited at step 502. In so doing, the present embodiment forms dual layer electroplated structures for use in a flat panel display device.

At step 508, the present embodiment removes remaining portions of the photoresist material which were deposited at step 504, such that the dual layer electroplated structures formed at step 506 remain above the substrate.

With reference next to step 510, the present embodiment then removes the base metal film which was residing beneath the photoresist structures formed at step 504 such that a dual layer structure for use in a field emission display is formed.

Thus, the present invention provides, in one embodiment, a structure on the display cathode which effectively directs electrons emitted from electron emitters. The present invention provides, in another embodiment, a structure on the faceplate which effectively separates neighboring phosphor sub-pixels. The present invention, in each of the above-mentioned embodiments, achieves the above-listed accomplishments without requiring the use of expensive and contaminant producing polyimide material.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the Claims appended hereto and their equivalents.

What is claimed is:

1. A low-contaminant dual layer apparatus adapted for use in a flat panel display device, said apparatus comprising:
    a dual layer electroplated structure for containing the movement of electrons, said electroplated structure residing within an active region of said flat panel display device, said electroplated structure having a cavity wherein a sub-pixel forming material is deposited therein and said electroplated structure containing substantially no organic material.

2. The low-contaminant dual layer apparatus adapted for use in a flat panel display device as recited in claim 1 wherein said dual layer electroplated structure is a black matrix.

3. The low-contaminant dual layer apparatus adapted for use in a flat panel display device as recited in claim 1 wherein said dual layer electroplated structure is a focus structure.

\* \* \* \* \*